(12) United States Patent
Yang et al.

(10) Patent No.: US 8,642,460 B2
(45) Date of Patent: Feb. 4, 2014

(54) SEMICONDUCTOR SWITCHING DEVICE AND METHOD OF MAKING THE SAME

(75) Inventors: Chih-Chao Yang, Glenmont, NY (US); Stephen A Cohen, Wappingers Falls, NY (US); Baozhen Li, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 160 days.

(21) Appl. No.: 13/155,757

(22) Filed: Jun. 8, 2011

(65) Prior Publication Data
US 2012/0313194 A1 Dec. 13, 2012

(51) Int. Cl.
*H01L 21/44* (2006.01)

(52) U.S. Cl.
USPC .............. 438/598; 257/774; 257/E29.325; 257/E21.585

(58) Field of Classification Search
USPC .......... 257/154, 155, 774, E29.325, E23.011, 257/E21.577, E21.585; 438/129, 598
See application file for complete search history.

(56) References Cited

U.S. PATENT DOCUMENTS

| | | | |
|---|---|---|---|
| 3,768,060 A | 10/1973 | Sobel | |
| 5,500,553 A * | 3/1996 | Ikegami | 257/538 |
| 5,834,824 A | 11/1998 | Shepherd et al. | |
| 6,418,049 B1 | 7/2002 | Kozicki et al. | |
| 6,667,245 B2 | 12/2003 | Chow et al. | |
| 6,731,007 B1 * | 5/2004 | Saito et al. | 257/762 |
| 6,747,583 B2 | 6/2004 | Tucholski et al. | |
| 6,807,079 B2 | 10/2004 | Mei et al. | |
| 6,853,049 B2 | 2/2005 | Herner | |
| 7,064,359 B2 * | 6/2006 | Ishida et al. | 257/192 |
| 7,193,325 B2 * | 3/2007 | Wu et al. | 257/760 |
| 7,701,047 B2 * | 4/2010 | Le Briz et al. | 257/690 |
| 7,723,801 B2 * | 5/2010 | Ahn | 257/377 |
| 7,872,251 B2 | 1/2011 | Kosowsky et al. | |
| 2002/0100984 A1 * | 8/2002 | Oshima et al. | 257/774 |
| 2005/0287803 A1 * | 12/2005 | Lee | 438/672 |
| 2006/0250534 A1 | 11/2006 | Kutscher et al. | |
| 2007/0082487 A1 | 4/2007 | Chiang et al. | |
| 2008/0061444 A1 * | 3/2008 | Lin et al. | 257/774 |
| 2012/0267793 A1 * | 10/2012 | Chibahara et al. | 257/774 |
| 2013/0062779 A1 * | 3/2013 | Zimmer et al. | 257/774 |

FOREIGN PATENT DOCUMENTS

WO    WO2009039523 A1    3/2009

OTHER PUBLICATIONS

PCT International Search Report for Application No. PCT/US2012/037212, mailed Apr. 4, 2013, pp. 1-4.*
PCT Application No. PCT/US2012/037212 Filed: May 10, 2012 PCT International Search Report and Written Opinion.

* cited by examiner

*Primary Examiner* — Daniel Luke
*Assistant Examiner* — Joseph C Nicely
(74) *Attorney, Agent, or Firm* — Parashos Kalaitzis (57) ABSTRACT

A switching device including a first dielectric layer having a first top surface, two conductive features embedded in the first dielectric layer, each conductive feature having a second top surface that is substantially coplanar with the first top surface of the first dielectric layer, and a set of discrete islands of a low diffusion mobility metal between the two conductive features. The discrete islands of the low diffusion mobility metal may be either on the first top surface or embedded in the first dielectric layer. The electric conductivity across the two conductive features of the switching device increases when a prescribed voltage is applied to the two conductive features. A method of forming such a switching device is also provided.

16 Claims, 7 Drawing Sheets

SEMICONDUCTOR SWITCHING DEVICE AND METHOD OF MAKING THE SAME

FIELD OF THE INVENTION

The present invention generally relates to integrated circuit design and fabrication. More particularly, the present invention relates to a semiconductor switching device and methods of fabricating the semiconductor switching device.

BACKGROUND OF THE INVENTION

In electronics, a switch is an electrical component which can connect or disconnect signals and communication paths between electrical devices. A switch is an important element in an integrated microelectronic system. Semiconductor switches are typically obtained through circuit design or microelectromechanical (MEM) design. U.S. Pat. No. 6,747,583 to Tucholski et al. describes a switch circuit comprising a compensating circuit with scaled current steering switches.

Due to their relatively low insertion loss and high isolation value at high frequencies, MEM switches are useful for controlling very high frequency lines, such as antenna feed lines and switches operating above 1 GHz. In U.S. Pat. No. 6,667,245 to Chow et al., a MEM switch is fabricated for integration into circuits utilizing typical CMOS processing steps. The MEM switch device made with these steps is readily integrable with other circuits.

However, the circuit design and MEM design both require extra steps to integrate the switching device with the microelectronic system. This will increase the overall fabrication cost of the microelectronic system. In addition, the switching device made through the circuit design or the MEM design also takes a significant chip area.

Accordingly, there exists a need for a switching device which occupies a small chip area in an integrated circuit and has low fabrication cost.

SUMMARY OF THE INVENTION

The present invention provides a switching device which occupies a relatively small chip area in a microelectronic system. In addition, the present invention also provides a method for making such a switching device which minimizes additional processing steps and allows easy implementation of the invention in a back end of the line (BEOL) interconnect structure.

A first embodiment introduces a switching device. The switching device includes a first dielectric layer having a first top surface; two conductive features embedded in the first dielectric layer, each conductive feature having a second top surface that is substantially coplanar with the first top surface of the first dielectric layer; and a set of discrete islands of a low diffusion mobility metal on the first top surface of the first dielectric layer and between the two conductive features.

A second embodiment introduces a switching device including a first dielectric layer having a first top surface; two conductive features embedded in the first dielectric layer, each conductive feature having a second top surface that is substantially coplanar with the first top surface of the first dielectric layer; and a set of discrete islands of a low diffusion mobility metal embedded in the first dielectric layer and located between the two conductive features.

In both embodiments, the electric conductivity across the two conductive features in the switching device increases when a prescribed voltage is applied to the two conductive features.

A third embodiment introduces a method of forming a switching device. The method includes providing a first dielectric layer having two conductive features embedded therein, the first dielectric layer having a first top surface that is substantially coplanar with a second top surface of each of the two conductive features; and forming a set of discrete islands of a low diffusion mobility metal on the first top surface of the first dielectric layer and between the two conductive features.

A fourth embodiment introduces a method of forming a switching device. The method includes providing a first dielectric layer having discrete islands of a low diffusion mobility metal embedded therein, wherein the first dielectric layer comprises a first dielectric film and a second dielectric film on the first dielectric film and the discrete islands of the low diffusion mobility metal are directly on the first dielectric film; forming two openings in the first dielectric layer, each of the two openings extending through the second dielectric film and partially through the first dielectric film; and forming two conductive features in the first dielectric layer by filling the two openings with a conductive material, wherein each of the two conductive features has a second top surface substantially coplanar with a first top surface of the first dielectric layer and a set of the discrete islands of the low diffusion mobility metal are between the two conductive features.

Other aspects and advantages of the present invention will become apparent from the following detailed description, taken in conjunction with the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

It will be appreciated that for simplicity and clarity of illustration, elements shown in the drawings have not necessarily been drawn to scale. For example, the dimensions of some of the elements may be exaggerated relative to other elements for purpose of clarity.

DETAILED DESCRIPTION OF THE INVENTION

The present invention will now be described more fully hereinafter with reference to the accompanying drawings in which preferred embodiments of the invention are shown. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numerals refer to like features throughout.

When an element, such as a layer, is referred to as being "on" or "over" another element, it can be directly on the other element or intervening elements may also be present. In contrast, when an element is referred to as being "directly on" or "directly over" another element, there are no intervening elements present. In addition, when an element, such as a surface is referred to as being "in direct contact" with another element, it directly touches the other element. On the other hand, when an element is referred to as being "in electrical contact" with another element, it can directly touch the other element, or there may be intervening conductive elements between them. Furthermore, the term "surface" is used to include surfaces with topography which is not completely flat.

The present invention provides a switching device which occupies a small chip area in an integrated circuit. In addition, the proposed structure and method of the preferred embodiments minimizes additional processing steps and allows easy implementation of the invention in a BEOL interconnect structure. The switching device includes a first dielectric layer having a first top surface, two conductive features embedded in the first dielectric layer, each conductive feature having a second top surface that is substantially coplanar with the first top surface of the first dielectric layer, and a set of discrete islands of a low diffusion mobility metal between the two conductive features.

Figure 1:
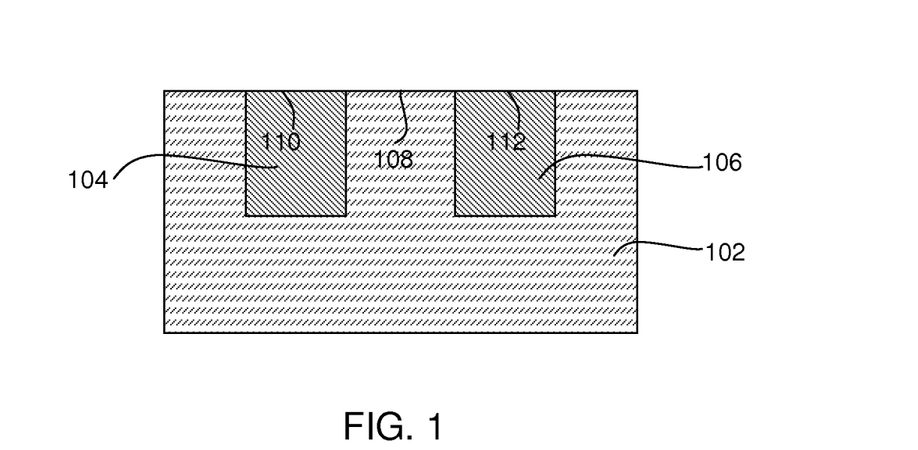
FIGS. 1-4 are cross-sectional views that illustrate the exemplary steps and corresponding structures of a method of making a switching device, in accordance with embodiments of the present invention.

In one preferred embodiment, the discrete islands of the low diffusion mobility metal are on the first top surface of the first dielectric layer. Referring now to FIG. 1, there is shown an initial interconnect structure 100. The initial interconnect structure 100 includes a first dielectric layer 102 and at least two conductive features 104 and 106. Conductive features 104 and 106 are embedded in the first dielectric layer 102 and separated by the dielectric material which forms the first dielectric layer 102. The first dielectric layer 102 has a first top surface 108 which is between the two conductive features 104 and 106. The two conductive features 104 and 106 each have a second top surface (110 and 112 respectively). In one embodiment, the first top surface 108 is substantially coplanar with the second top surfaces 110 and 112. The initial interconnect structure 100 may be located above a semiconductor substrate (not shown) including one or more semiconductor devices. Optionally, the initial interconnect structure 100 may further include a diffusion barrier layer (not shown) which separates the conductive features 104 and 106 from the first dielectric layer 102. The diffusion barrier layer is described below.

The initial structure 100 maybe made by conventional techniques well known to those skilled in the art. For example, the initial interconnect structure 100 can be formed by first applying the first dielectric layer 102 to a surface of a substrate (not shown). The substrate may be a semiconducting material, an insulating material, a conducting material or a combination of two or more of the foregoing materials. When the substrate is comprised of a semiconducting material, a semiconductor material such as Si, SiGe, SiGeC, SiC, Ge alloys, GaAs, InAs, InP or other group III/V or II/VI semiconductor materials may be used. In addition to these listed types of semiconducting materials, the present invention also contemplates cases in which the substrate is a layered semiconductor such as, for example, Si/SiGe, Si/SiC, silicon-on-insulators (SOIs) or silicon germanium-on-insulators (SGOIs). When the substrate is a semiconducting material, one or more semiconductor devices such as, for example, complementary metal oxide semiconductor (CMOS) devices may be fabricated thereon.

When the substrate is an insulating material, the insulating material can be an organic insulator (i.e., carbon-based dielectric materials which do not contain Si), an inorganic insulator (i.e., Si-based dielectric materials) or a combination of an organic insulator and an inorganic insulator. The substrate can be either single layer or multilayers.

When the substrate is a conducting material, the substrate may include, for example, polysilicon, an elemental metal, an alloy of elemental metals, a metal silicide, a metal nitride or a combination of two or more of the foregoing materials. The substrate can be either single layer or multilayers.

The first dielectric layer 102 may be any interlevel or intralevel dielectrics including inorganic dielectrics or organic dielectrics. The first dielectric layer 102 may be porous or non-porous. Examples of suitable dielectrics that can be used as the first dielectric layer 102 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or substituted aryl moieties which are linked together by bonds, fused rings, or inert linking groups such as, for example, oxygen, sulfur, sulfone, sulfoxide, carbonyl and the like.

Preferably, the first dielectric layer 102 has a dielectric constant of about 4.0 or less. More preferably, the first dielectric layer 102 has a dielectric constant of about 2.8 or less. These dielectrics generally have a lower parasitic crosstalk as compared with dielectric materials that have a dielectric constant higher than 4.0. The dielectric constants mentioned herein are measured in a vacuum.

The thickness of the first dielectric layer 102 may vary depending on the dielectric material used as well as the exact number of dielectric films within the initial interconnects structure 100. Typically, and for normal interconnect structures, the first dielectric layer 102 has a thickness from about 100 nm to about 450 nm.

The conductive features 104 and 106 may be formed by lithography. For example, a photoresist layer is applied to the surface of the first dielectric layer 102. The photoresist layer is exposed to a desired pattern of radiation. The exposed photoresist layer is developed utilizing a resist developer. The patterned photoresist layer is used as an etch mask to transfer the pattern into the first dielectric layer 102. The etched region of the first dielectric layer 102 is then filled with a conductive material to form the conductive features 104 and 106.

The conductive features 104 and 106 include, but are not limited to, a conductive metal, an alloy of two or more conductive metals, a conductive metal silicide or a combination of two or more of the foregoing materials. Preferably, the conductive features 104 and 106 are a conductive metal such as Cu, Al, W, Ag, Ti, Ta or their alloys. More preferably, the conductive features 104 and 106 are Cu or a Cu alloy (such as AlCu). The conductive material is filled into the etched region of the first dielectric layer 102 using a conventional deposition process including, but not limited to, chemical vapor deposition (CVD), plasma enhanced chemical vapor deposition (PECVD), sputtering, chemical solution deposition or plating to form the conductive features 104 and 106. After deposition, a conventional planarization process such as, for example, chemical mechanical polishing (CMP) can be used to provide a structure in which the conductive features 104 and 106 have top surfaces 110 and 112 that are substantially coplanar with the top surface 108 of the first dielectric layer 102.

The conductive features 104 and 106 are preferably separated from the first dielectric layer 102 by a diffusion barrier layer (not shown). The diffusion barrier layer may include, but is not limited to, Ta, TaN, Ti, TiN, Ru, RuN, RuTa, RuTaN, W, WN, Co, CoW, Mn, MnO, combinations of two or more of the foregoing materials or any other material that can serve as a barrier to prevent a conductive material from diffusing into a dielectric material layer. The diffusion barrier layer may be formed by a deposition process such as, for example, atomic layer deposition (ALD), CVD, PECVD, physical vapor deposition (PVD), sputtering, chemical solution deposition, or plating. The diffusion barrier layer may also include a bilayer structure that includes a lower layer of a metallic nitride such as, for example, TaN and an upper metallic layer such as, for example, Ta.

The thickness of the diffusion barrier layer may vary depending on the exact means of the deposition process as well as the material employed. Typically, the diffusion barrier layer has a thickness from about 2 nm to about 40 nm, with a thickness from about 4 nm to about 20 nm being more typical. During the planarization process described above, the diffusion barrier layer may also be planarized such that the diffusion barrier layer is also substantially coplanar with the first dielectric layer 102 and the conductive features 104 and 106 in the initial interconnect structure 100.

Figure 2A:
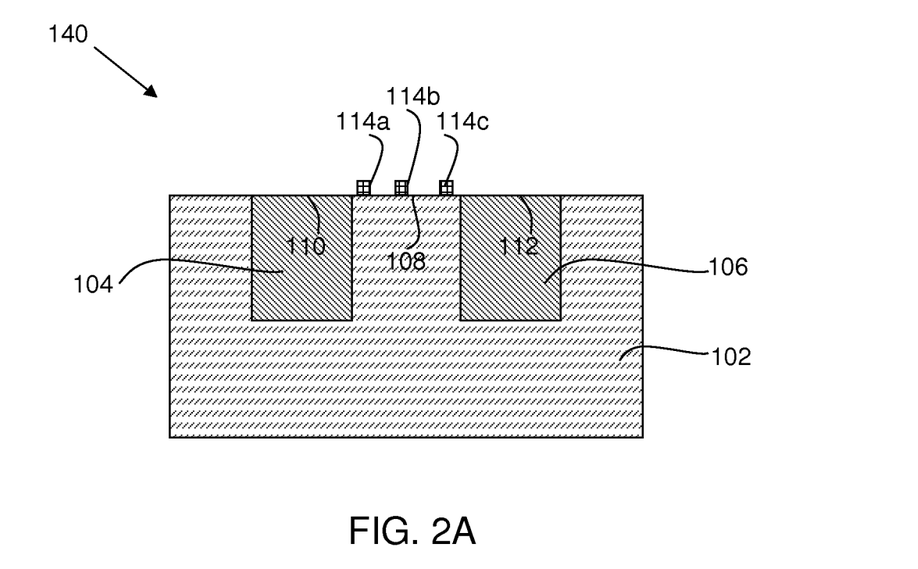

After forming the at least two conductive features 104 and 106 within the first dielectric layer 102, a set of discrete islands (114a-c) of a low diffusion mobility metal are formed on the first top surface 108 to form a switching device 140 (FIG. 2A). In the switching device 140, the discrete islands 114a-c are located between the two conductive features 104 and 106. In one preferred embodiment, the discrete islands 114a-c are in direct contact with the first top surface 108. The low diffusion mobility metal that forms the discrete islands 114a-c preferably has a value of diffusivity less than $10^{-10}$ m$^2$/s in the first dielectric layer 102. Low diffusion mobility metals that can be used to form the discrete islands in the present invention include, but are not limited to, Ru, Rh, Pd, Ag, Os, Ir, Pt, Au, Co, Ta, Ti, Mn, W, and alloys comprising at least one of the foregoing metals.

The discrete islands 114a-c may be formed by a number of deposition techniques, including CVD, ALD, electroless plating and electroplating. The thickness of the discrete islands 114a-c may vary depending on the type of material used for the discrete islands and the deposition technique and conditions. In addition, the discrete islands 114a-c may have different thicknesses. Typically, the discrete islands 114a-c have a thickness from about 1 Å to about 20 Å, with a thickness from about 2 Å to about 5 Å being more typical. The discrete islands 114a-c are typically separated by a distance from about 0.5 nm to about 20 nm, with a distance from about 1 nm to about 10 nm being more typical. In some embodiments, the distance between the two neighboring islands may be non-uniform. For example, the distance between islands 114a and 114b may be different from the distance between islands 114b and 114c.

In the switching device 140 as shown in FIG. 2A, the electric conductivity across the two conductive features 104 and 106 is initially low and the switching device is in "off" state. When a prescribed voltage is applied to the two conductive features 104 and 106, the electric conductivity across the two conductive features increases such that the switching device becomes "on". The increase in electric conductivity may be due to a temporary dielectric breakdown between two adjacent conductors at a high electrical bias condition. In one preferred embodiment, the electric conductivity across the two conductive features 104 and 106 increases by more than three orders of magnitudes when a prescribed voltage is applied. In one embodiment, the prescribed voltage is 3V or greater.

Figure 2B:
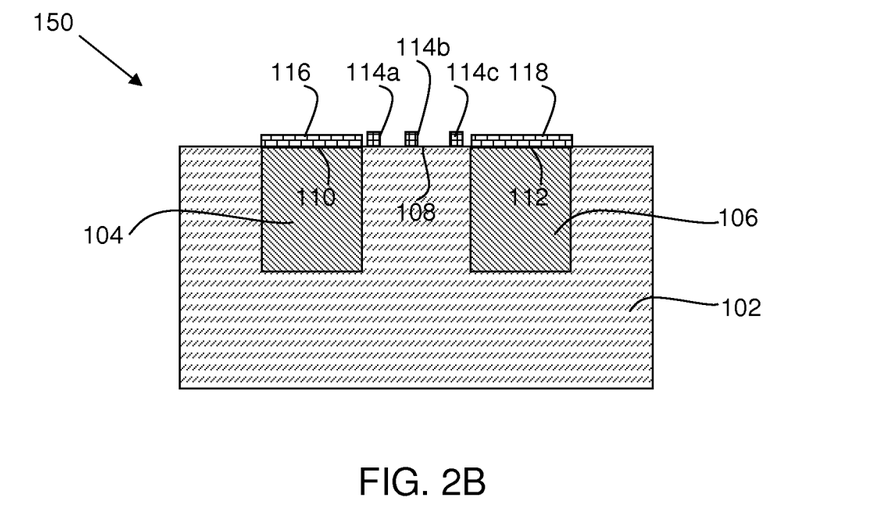
Figure 2C:
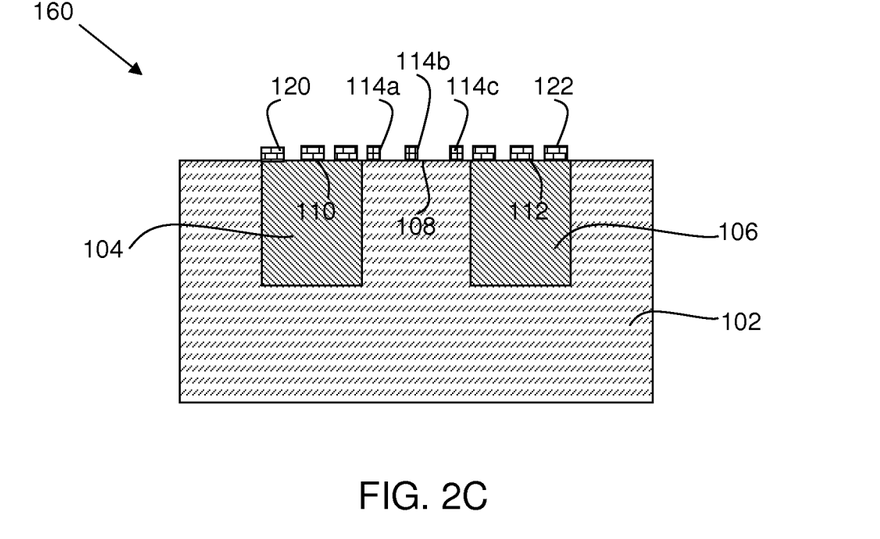

Coatings of the low diffusion mobility metal may also form on the two conductive features 104 and 106 during the formation of the discrete islands 114a-c. In one embodiment, continuous coatings 116 and 118 of the low diffusion mobility metal are formed on the two conductive features 104 and 106 respectively (FIG. 2B). In another embodiment, discontinuous coatings 120 and 122 of the low diffusion mobility metal are formed on the two conductive features 104 and 106 respectively (FIG. 2C). The existence of these coatings on the two conductive features does not significantly affect the properties of the resulting devices. Both devices 150 and 160 with the coatings of the low diffusion mobility metal on the two conductive features 104 and 106 behave as switching devices, similar as the device 140.

Figure 3:
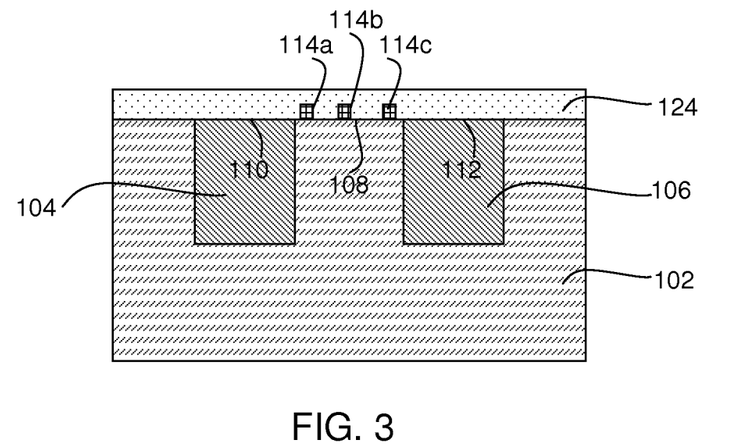

In FIG. 3, a dielectric cap layer 124 is formed directly on the first top surface 108 and the second top surfaces 110 and 112. The dielectric cap layer 124 is formed by a conventional deposition process such as, for example, CVD, PECVD, chemical solution deposition, or evaporation. The dielectric cap layer 124 may be any suitable dielectric capping material including, but not limited to, SiC, Si$_4$NH$_3$, SiO$_2$, a carbon doped oxide, a nitrogen and hydrogen doped silicon carbide (SiC(N,H)), or multilayers thereof. The thickness of the dielectric cap layer 124 may vary depending on the exact means of the deposition process as well as the material employed. Typically, the dielectric cap layer 124 has a thickness from about 5 nm to about 80 nm, with a thickness from about 10 nm to about 50 nm being more typical. Preferably, the dielectric cap layer 124 is thicker than the discrete islands 114a-c such that the discrete islands 114a-c are embedded in the dielectric cap layer 124.

Figure 4:
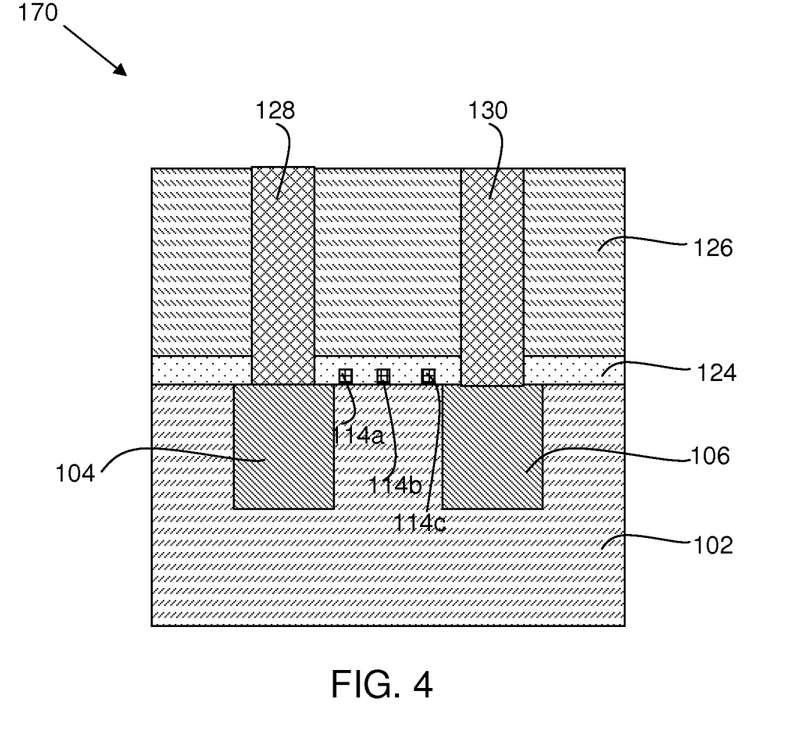

In FIG. 4, a second dielectric layer 126 is formed on the dielectric cap layer 124. All dielectric materials suitable for the first dielectric layer 102 as described above may be used to form the second dielectric layer 126. The second dielectric layer 126 may be the same or different material as the first dielectric layer 102. Typically, the second dielectric layer 126 has a thickness from about 100 nm to about 450 nm.

After the second dielectric layer 126 is formed, two conductive features 128 and 130 are formed in the second dielectric layer 126 to form a switching device 170. As shown in FIG. 4, the conductive features 128 and 130 extend through both the second dielectric layer 126 and the dielectric cap layer 124 and are in electrical contact with the two conductive features 104 and 106 in the first dielectric layer 102 respectively. The switching device 170 may be operated by applying a prescribed voltage to the conductive features 128 and 130. When a prescribed voltage is applied to the two conductive features 128 and 130, the electric conductivity across the two conductive features increases, similar to the switching device 140. The conductive features 128 and 130 may have single damascene or dual damascene structures.

The two conductive features 128 and 130 may be formed by lithography, similar to the conductive features 104 and 106. The conductive features 128 and 130 include, but are not limited to, a conductive metal, an alloy of two or more conductive metals, a conductive metal silicide or a combination of two or more of the foregoing materials. Preferably, the conductive features 128 and 130 are a conductive metal such as Cu, Al, W, Ag, Ti, Ta or their alloys. More preferably, the conductive features 128 and 130 are Cu or a Cu alloy (such as AlCu). The conductive features 128 and 130 may be formed by CVD, PECVD, sputtering, chemical solution deposition or plating. After deposition, a conventional planarization process such as, for example, CMP can be used to provide a structure in which the conductive features 128 and 130 have top surfaces that are substantially coplanar with the top surface of the second dielectric layer 126.

The conductive features 128 and 130 are preferably separated from the second dielectric layer 126 and the dielectric cap layer 124 by a diffusion barrier layer (not shown). The diffusion barrier layer may include, but is not limited to, Ta, TaN, Ti, TiN, Ru, RuN, RuTa, RuTaN, W, WN, Co, CoW, Mn, MnO, combinations of two or more of the foregoing materials or any other material that can serve as a barrier to prevent a conductive material from diffusing into a dielectric material layer. The diffusion barrier layer may be formed by a deposition process such as, for example, ALD, CVD, PECVD, PVD, sputtering, chemical solution deposition, or plating. The diffusion barrier layer may also include a bilayer structure that includes a lower layer of a metallic nitride such as, for example, TaN and an upper metallic layer such as, for example, Ta. Typically, the diffusion barrier layer has a thickness from about 2 nm to about 40 nm, with a thickness from about 4 nm to about 20 nm being more typical.

Figure 5:
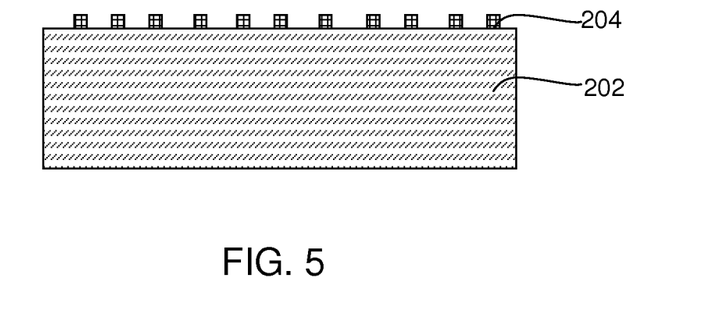
FIGS. 5-11 are cross-sectional views that illustrate the exemplary steps and corresponding structures of another method of making a switching device, in accordance with embodiments of the present invention.
Figure 6:
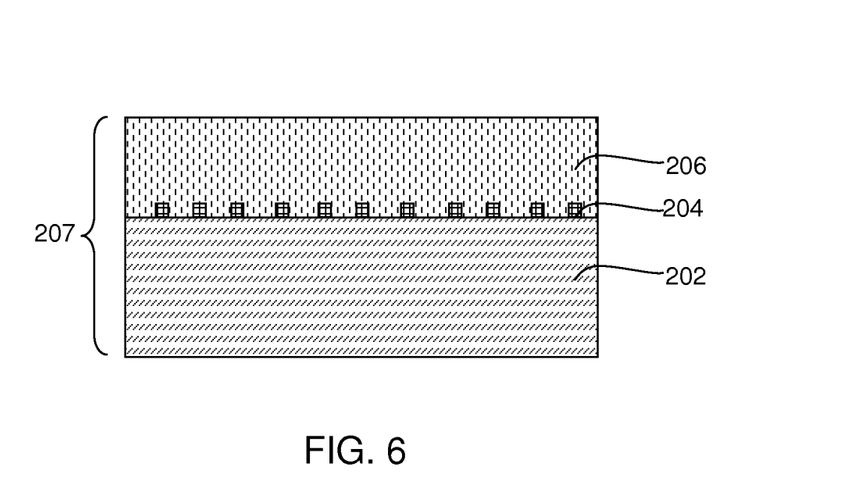

In another preferred embodiment, the discrete islands of the low diffusion mobility metal in the switching device of the present invention are embedded in the first dielectric layer. Referring to FIGS. 5-6, discrete islands of a low diffusion mobility metal 204 are first formed directly on a first dielectric film 202. A second dielectric film 206 is then formed on the first dielectric film 202. The first and second dielectric films 202 and 206 form a first dielectric layer 207. As shown in FIG. 6, the discrete islands 204 now are embedded in the first dielectric layer 207. The first dielectric film 202 may be located above a semiconductor substrate (not shown) including one or more semiconductor devices.

The first and second dielectric films 202 and 206 may be formed from the dielectric materials suitable for the first dielectric layer 102, as described above. The first and second dielectric films 202 and 206 may be formed from the same or different dielectric materials. Typically, the first and second dielectric films 202 and 206 have a thickness from about 50 nm to about 250 nm. The first and second dielectric films 202 and 206 may have different thicknesses. The first dielectric layer 207 may have a thickness from about 100 nm to about 450 nm.

The discrete islands 204 may be formed from the materials suitable for the discrete islands 114a-c, as described above. The low diffusion mobility metal that forms the discrete islands 204 preferably has a value of diffusivity less than $10^{-10}$ m$^2$/s in the first dielectric layer 207. Low diffusion mobility metals that can be used to form the discrete islands in the present invention include, but are not limited to, Ru, Rh, Pd, Ag, Os, Ir, Pt, Au, Co, Ta, Ti, Mn, W, and alloys comprising at least one of the foregoing metals.

Similarly, the discrete islands 204 may be formed by the deposition techniques used to form the discrete islands 114a-c, including CVD, ALD, electroless plating and electroplating. The thickness of the discrete islands 204 may vary depending on the type of material used for the discrete islands and the deposition technique and conditions. In addition, the discrete islands 204 may have different thicknesses. Typically, the discrete islands 204 have a thickness from about 1 Å to about 20 Å, with a thickness from about 2 Å to about 5 Å being more typical. The discrete islands 204 are typically separated by a distance from about 0.5 nm to about 20 nm, with a distance from about 1 nm to about 10 nm being more typical. In some embodiments, the distance between the two neighboring islands may be non-uniform.

Figure 7:
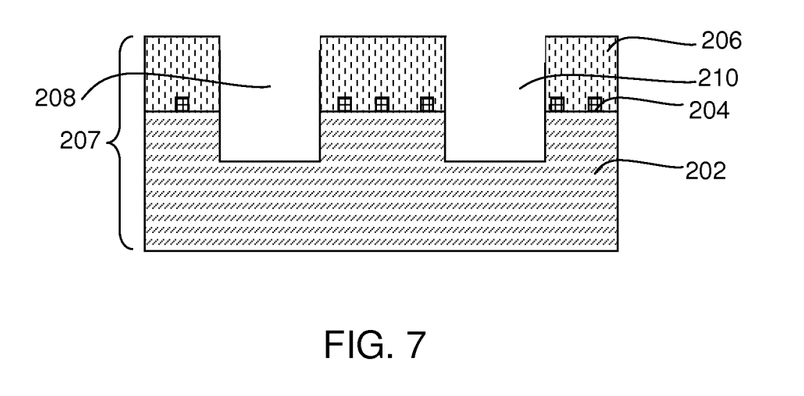

In FIG. 7, two openings 208 and 210 are formed in the first dielectric layer 207. The openings 208 and 210 extend through the second dielectric film 206 and partially through the first dielectric film 202. The openings 208 and 210 may be formed by lithography. For example, a photoresist layer is applied to the surface of the first dielectric layer 207. The photoresist layer is exposed to a desired pattern of radiation. The exposed photoresist layer is developed utilizing a resist developer. The patterned photoresist layer is used as an etch mask to transfer the pattern into the first dielectric layer 207.

Figure 8:
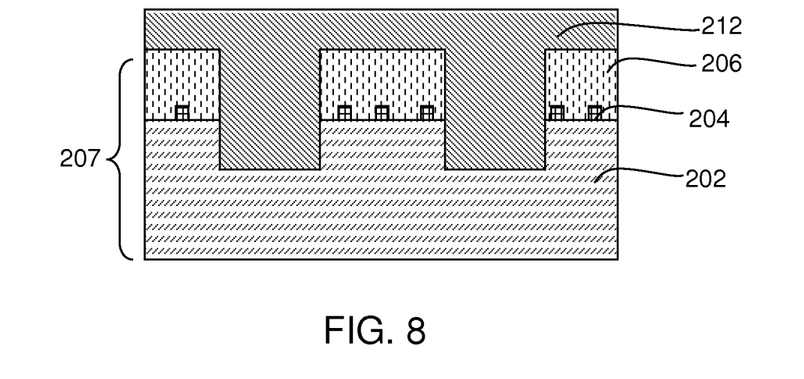
Figure 9:
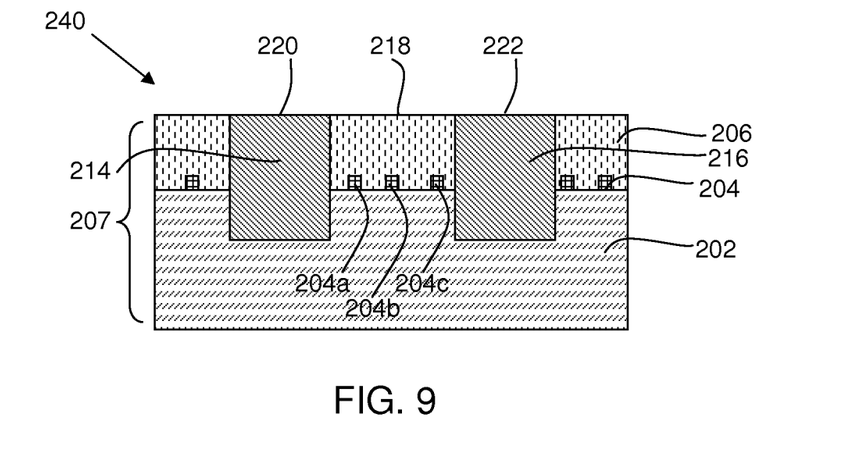

In FIG. 8, the two openings 208 and 210 are filled with a conductive material 212. After deposition, a conventional planarization process such as, for example, CMP is used to provide a switching device 240, as shown in FIG. 9. In the device 240, the two conductive features 214 and 216 have top surfaces 220 and 222 respectively that are substantially coplanar with a top surface 218 of the first dielectric layer 207.

The conductive material 212 may be the same material for the conductive features 104 and 106, as described above. Preferably, the conductive material 212 is a conductive metal such as Cu, Al, W, Ag, Ti, Ta or their alloys. More preferably, the conductive material 212 is Cu or a Cu alloy (such as AlCu). The conductive material 212 is filled using a conventional deposition process including, but not limited to, CVD, PECVD, sputtering, chemical solution deposition or plating.

The conductive features 220 and 222 are preferably separated from the first dielectric layer 207 by a diffusion barrier layer (not shown). The diffusion barrier layer may include, but is not limited to, Ta, TaN, Ti, TiN, Ru, RuN, RuTa, RuTaN, W, WN, Co, CoW, Mn, MnO, combinations of two or more of the foregoing materials or any other material that can serve as a barrier to prevent a conductive material from diffusing into a dielectric material layer. The diffusion barrier layer may be formed by a deposition process such as, ALD, CVD, PECVD, PVD, sputtering, chemical solution deposition, or plating. The diffusion barrier layer may also include a bilayer structure that includes a lower layer of a metallic nitride such as, for example, TaN and an upper metallic layer such as, for example, Ta.

Typically, the diffusion barrier layer has a thickness from about 2 nm to about 40 nm, with a thickness from about 4 nm to about 20 nm being more typical. During the planarization process described above, the diffusion barrier layer may also be planarized such that the diffusion barrier layer is also substantially coplanar with the first dielectric layer 207 and the conductive features 220 and 222 in the switching device 240.

In the switching device 240, a set of the discrete islands (204a-c) are between the two conductive features 220 and 222. The electric conductivity across the two conductive features 220 and 222 is initially low and the switching device is in "off" state. When a prescribed voltage is applied to the two conductive features 220 and 222, the electric conductivity across the two conductive features increases such that the switching device becomes "on". In one preferred embodiment, the electric conductivity across the two conductive features 220 and 222 increases by more than three orders of magnitudes when a prescribed voltage is applied. In one embodiment, the prescribed voltage is 3V or greater.

Figure 10:
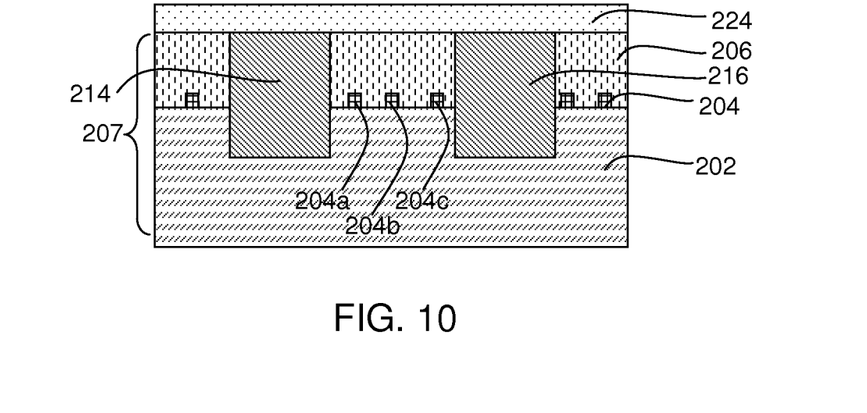

In FIG. 10, a dielectric cap layer 224 is formed directly on the first top surface 218 and the second top surfaces 220 and 222. The dielectric cap layer 224 is formed by the same process and from the same materials suitable for the dielectric cap layer 124, as described above. The thickness of the dielectric cap layer 224 may vary depending on the exact means of the deposition process as well as the material employed. Typically, the dielectric cap layer 224 has a thickness from about 5 nm to about 80 nm, with a thickness from about 10 nm to about 50 nm being more typical.

Figure 11:
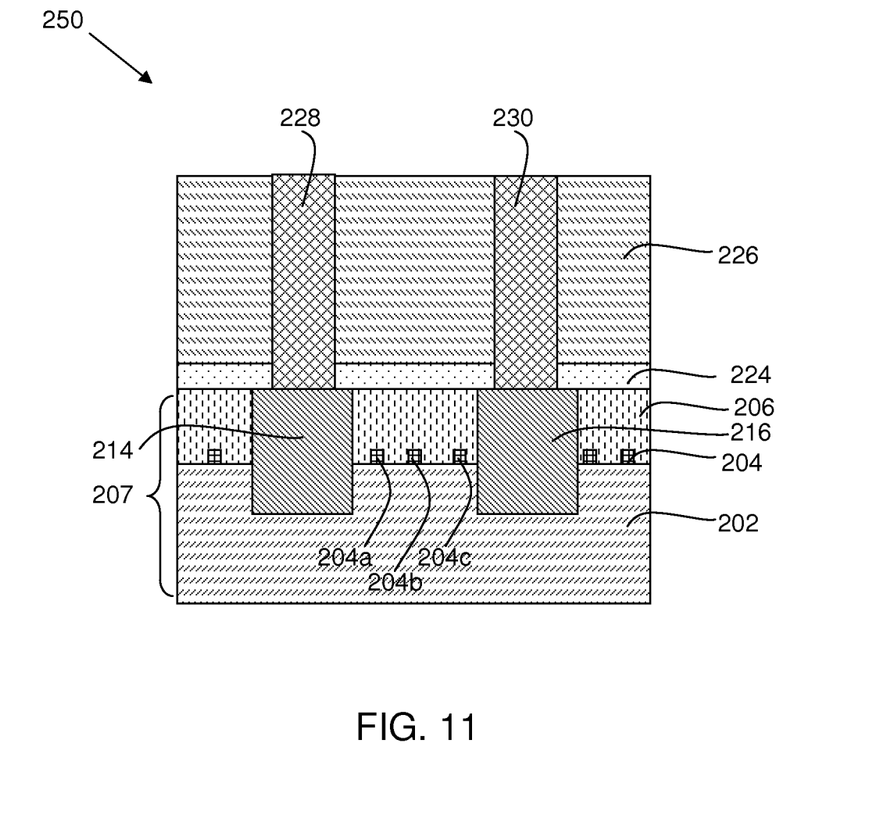

In FIG. 11, a second dielectric layer 226 is formed on the dielectric cap layer 224. All dielectric materials suitable for the first dielectric layer 102 as described above may be used to form the second dielectric layer 226. The second dielectric layer 226 may be the same or different material as the first dielectric film 202 or the second dielectric film 206. Typically, the second dielectric layer 226 has a thickness from about 100 nm to about 450 nm.

After the second dielectric layer 226 is formed, two conductive features 228 and 230 are then formed in the second dielectric layer 226 to form a switching device 250. The conductive features 228 and 230 extend through both the second dielectric layer 226 and the dielectric cap layer 224 and are in electrical contact with the two conductive features 214 and 216 in the first dielectric layer 207 respectively. The switching device 250 may be operated by applying a prescribed voltage to the conductive features 228 and 230. When a prescribed voltage is applied to the two conductive features 228 and 230, the electric conductivity across the two conductive features increases, similar to the switching device 240. The conductive features 228 and 230 may have single damascene or dual damascene structures.

The two conductive features 228 and 230 may be formed by lithography, similar to the conductive features 104 and 106. All materials suitable for the conductive features 104 and 16 as described above can be used to form the conductive features 228 and 230. The conductive features 228 and 230 may be formed by CVD, PECVD, sputtering, chemical solution deposition or plating. After deposition, a conventional planarization process such as, for example, CMP can be used to provide a structure in which the conductive features 228 and 230 have top surfaces that are substantially coplanar with the top surface of the second dielectric layer 226.

The conductive features 228 and 230 are preferably separated from the second dielectric layer 226 and the dielectric cap layer 224 by a diffusion barrier layer (not shown). The diffusion barrier layer may include, but is not limited to, Ta, TaN, Ti, TiN, Ru, RuN, RuTa, RuTaN, W, WN, Co, CoW, Mn, MnO, combinations of two or more of the foregoing materials or any other material that can serve as a barrier to prevent a conductive material from diffusing into a dielectric material layer. The diffusion barrier layer may be formed by a deposition process such as, for example, ALD, CVD, PECVD, PVD, sputtering, chemical solution deposition, or plating. The diffusion barrier layer may also include a bilayer structure that includes a lower layer of a metallic nitride such as, for example, TaN and an upper metallic layer such as, for example, Ta. Typically, the diffusion barrier layer has a thickness from about 2 nm to about 40 nm, with a thickness from about 4 nm to about 20 nm being more typical.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A switching device comprising:
   a first dielectric layer having a first top surface;
   two conductive features embedded in the first dielectric layer, each conductive feature having a second top surface that is substantially coplanar with the first top surface of the first dielectric layer; and
   a set of discrete islands of a low diffusion mobility metal embedded in the first dielectric layer and located between the two conductive features, wherein the electric conductivity across the two conductive features increases when a prescribed voltage is applied to the two conductive features.

2. The switching device of claim 1, wherein the first dielectric layer comprises at least two dielectric films.

3. The switching device of claim 1, wherein the low diffusion mobility metal has a value of diffusivity less than $10^{-10}$ m$^2$/s in the first dielectric layer.

4. The switching device of claim 3, wherein the low diffusion mobility metal is selected from the group consisting of Ru, Rh, Pd, Ag, Os, Ir, Pt, Au, Co, Ta, Ti, Mn, W, and alloys comprising at least one of the foregoing metals.

5. The switching device of claim 1, wherein the discrete islands of the low diffusion mobility metal have a thickness from about 1 Å to about 20 Å.

6. The switching device of claim 1, wherein the discrete islands of the low diffusion mobility metal are separated by a distance from about 0.5 nm to about 20 nm.

7. The switching device of claim 1, wherein the two conductive features are selected from the group consisting of Cu, Al, W, Ag, Ti, Ta and alloys comprising at least one of the foregoing metals.

8. The switching device of claim 1, further comprising:
   a dielectric cap layer directly on the first top surface and the second top surface.

9. The switching device of claim 8, further comprising:
   a second dielectric layer having two conductive features embedded therein on the dielectric cap layer, wherein each of the two conductive features in the second dielectric layer is in electrical contact with one of the two conductive features in the first dielectric layer.

10. A method of forming a switching device comprising:
    providing a first dielectric layer having discrete islands of a low diffusion mobility metal embedded therein, wherein the first dielectric layer comprises a first dielectric film and a second dielectric film on the first dielectric film and the discrete islands of the low diffusion mobility metal are directly on the first dielectric film;
    forming two openings in the first dielectric layer, each of the two openings extending through the second dielectric film and partially through the first dielectric film; and
    forming two conductive features in the first dielectric layer by filling the two openings with a conductive material, wherein each of the two conductive features has a second top surface substantially coplanar with a first top surface of the first dielectric layer and a set of the discrete islands of the low diffusion mobility metal are between the two conductive features, wherein the electric conductivity across the two conductive features increases when a prescribed voltage is applied to the two conductive features.

11. The method of claim 10, wherein the low diffusion mobility metal is selected from the group consisting of Ru, Rh, Pd, Ag, Os, Ir, Pt, Au, Co, Ta, Ti, Mn, W, and alloys comprising at least one of the foregoing metals.

12. The method of claim 10, wherein the discrete islands of the low diffusion mobility metal are formed by chemical vapor deposition (CVD), atomic layer deposition (ALD), electroless plating or electroplating.

13. The method of claim 10, wherein the discrete islands of the low diffusion mobility metal have a thickness from about 1 Å to about 20 Å.

14. The method of claim 10, wherein the discrete islands of the low diffusion mobility metal are separated by a distance from about 0.5 nm to about 20 nm.

15. The method of claim 10, further comprising:
    forming a dielectric cap layer directly on the first top surface and the second top surface.

16. The method of claim 10, further comprising:
    forming a second dielectric layer having two conductive features embedded therein on the dielectric cap layer, wherein each of the two conductive features in the second dielectric layer is in electrical contact with one of the two conductive features in the first dielectric layer.

* * * * *